(12) United States Patent
Nasu

(10) Patent No.: US 11,971,144 B2
(45) Date of Patent: Apr. 30, 2024

(54) PROCESSING APPARATUS AND GAS SUPPLY METHOD

(71) Applicant: Tokyo Electron Limited, Tokyo (JP)

(72) Inventor: Seiya Nasu, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/686,663

(22) Filed: Mar. 4, 2022

(65) Prior Publication Data

US 2022/0290814 A1 Sep. 15, 2022

(30) Foreign Application Priority Data

Mar. 12, 2021 (JP) .................... 2021-040645

(51) Int. Cl.
*F17C 9/00* (2006.01)
*C23C 14/22* (2006.01)

(52) U.S. Cl.
CPC .............. *F17C 9/00* (2013.01); *C23C 14/228* (2013.01); *F17C 2205/0338* (2013.01); *F17C 2223/0123* (2013.01); *F17C 2223/038* (2013.01); *F17C 2225/038* (2013.01); *F17C 2250/043* (2013.01); *F17C 2250/0626* (2013.01); *F17C 2270/0518* (2013.01)

(58) Field of Classification Search
CPC ...... F17C 2205/0338; F17C 2223/0123; F17C 2223/038; F17C 2225/038; F17C 2250/043; F17C 2250/0626; F17C 2270/0518; C23C 14/228
USPC ........................................ 141/192
See application file for complete search history.

(56) References Cited

U.S. PATENT DOCUMENTS

| | | | |
|---|---|---|---|
| 2013/0133759 A1* | 5/2013 | Kato | H01M 8/2457 137/488 |
| 2014/0007950 A1* | 1/2014 | Takijiri | G05D 16/20 137/485 |
| 2017/0275757 A1* | 9/2017 | Kikuchi | C23C 16/45561 |
| 2020/0098594 A1* | 3/2020 | Kiyohara | H01L 21/67034 |

FOREIGN PATENT DOCUMENTS

JP 2017-179397 A 10/2017

* cited by examiner

*Primary Examiner* — Umashankar Venkatesan
*Assistant Examiner* — Christopher M Afful
(74) *Attorney, Agent, or Firm* — Venjuris, P.C.

(57) ABSTRACT

A processing apparatus includes: a processing container configured to accommodate a substrate; a storage tank connected to the processing container via a gas supply pipe; a pressure sensor configured to detect a pressure in the storage tank; a valve provided in the gas supply pipe between the processing container and the storage tank; and a controller configured to control an opening degree of the valve based on the pressure in the storage tank detected by the pressure sensor.

10 Claims, 4 Drawing Sheets

FIG. 4

| CONDI-TION | TANK INTERNAL PRESSURE DURING STORAGE [Torr] | TARGET TANK INTERNAL PRESSURE [Torr] | SET DISCHARGE AMOUNT (SET DISCHARGE PRESSURE) [Torr] | ACTUAL DISCHARGE AMOUNT (ACTUAL DISCHARGE PRESSURE) [Torr] | ERROR [Torr] |
|---|---|---|---|---|---|
| A | 380 | 80 | 300 | 299.3058 | −0.69425 |
| B | 360 | 60 | 300 | 300.862 | −0.862 |
| C | 310 | 20 | 290 | 291.8288 | 1.82875 |
| D | 340 | 30 | 310 | 309.0105 | −0.9895 |
| E | 300 | 20 | 280 | 281.1933 | 1.19325 |

PROCESSING APPARATUS AND GAS SUPPLY METHOD

CROSS-REFERENCE TO RELATED APPLICATIONS

This application is based on and claims priority from Japanese Patent Application No. 2021-040645, filed on Mar. 12, 2021, with the Japan Patent Office, the disclosure of which is incorporated herein in its entirety by reference.

TECHNICAL FIELD

The present disclosure relates to a processing apparatus and a gas supply method.

BACKGROUND

A technique is known which takes a detection value of a pressure sensor on a secondary side of a processing container into a controller, and controls an amount of gas supplied into the processing container to make the pressure inside the processing container become a constant pressure (see, e.g., Japanese Patent Laid-Open Publication No. 2017-179397).

SUMMARY

According to an aspect of the present disclosure, a processing apparatus includes: a processing container configured to accommodate a substrate; a storage tank connected to the processing container via a gas supply pipe; a pressure sensor configured to detect a pressure in the storage tank; a valve provided in the gas supply pipe between the processing container and the storage tank; and a controller configured to control an opening degree of the valve based on the pressure in the storage tank detected by the pressure sensor.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is a view illustrating results obtained from calculating an error between a set discharge amount and an actual discharge amount.

DETAILED DESCRIPTION

Figure 1:
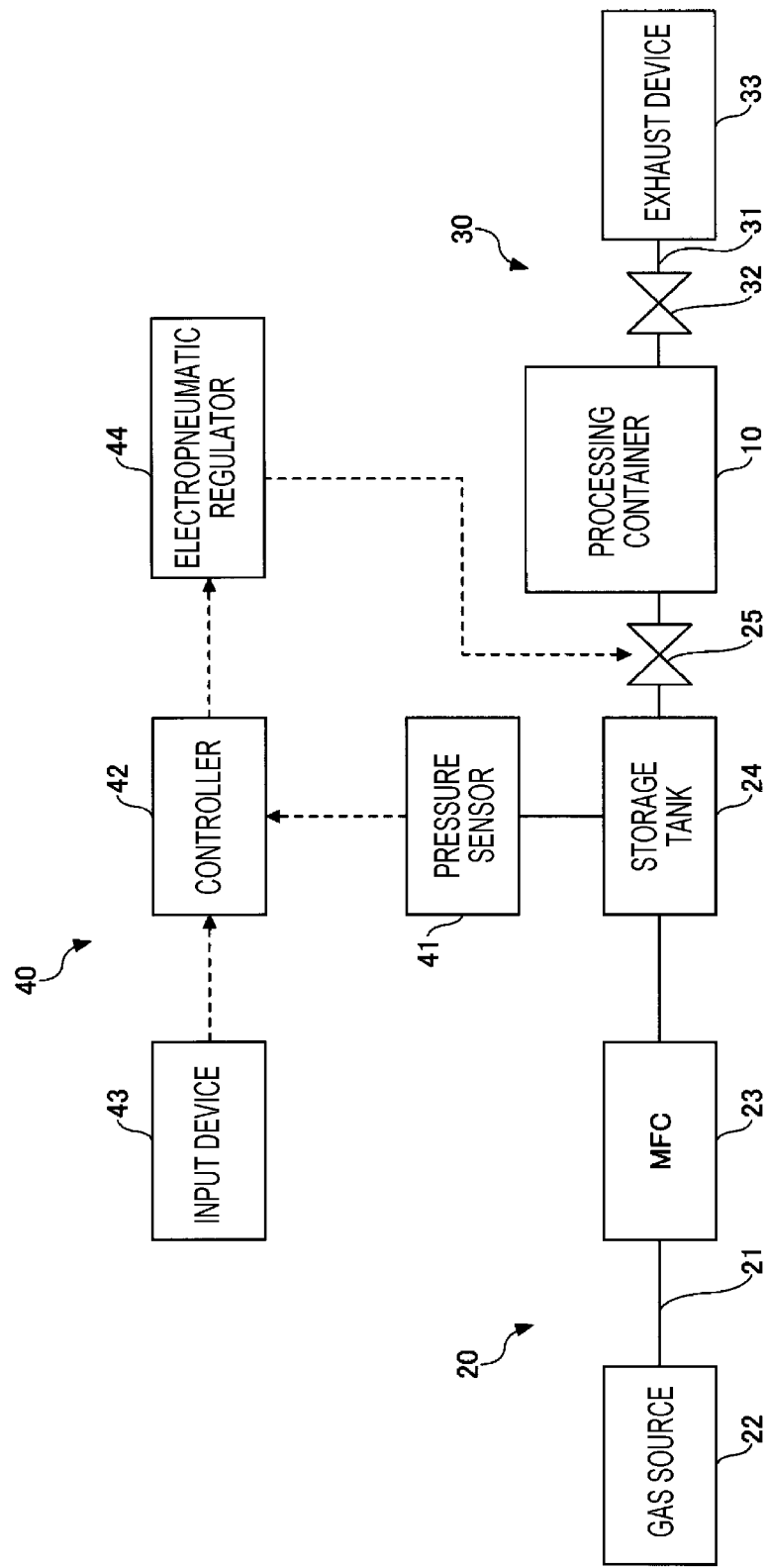
FIG. 1 is a block diagram illustrating an example of a processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In all of the drawings, the same or corresponding members or parts will be denoted by the same or corresponding reference numerals, and overlapping descriptions thereof will be omitted.

[Processing Apparatus]

An example of a processing apparatus of an embodiment will be described with reference to FIG. 1. FIG. 1 is a block diagram illustrating an example of the processing apparatus of the embodiment.

The processing apparatus 1 includes, for example, a processing container 10, a gas supply 20, an exhaust 30, and a discharge amount controller 40.

The processing container 10 is a vertical container for accommodating a boat that holds substrates in a horizontal posture on multiple tiers in the vertical direction, and performing a substrate processing. The processing container 10 may be a container that accommodates a stage for placing one or more substrates thereon, and performs a substrate processing. The substrate is, for example, a semiconductor wafer. The substrate processing includes various types of processing for processing a substrate by supplying a processing gas into the processing container 10, such as, for example, a film forming process and an etching process. The film forming process includes, for example, atomic layer deposition (ALD) and chemical vapor deposition (CVD).

The gas supply 20 includes, for example, a gas supply pipe 21, a gas source 22, a mass flow controller 23, a storage tank 24, and a furnace opening valve 25.

The gas supply pipe 21 supplies a processing gas from the gas source 22 into the processing container 10, and is connected to, for example, an injector (not illustrated) that introduces the processing gas into the processing container 10. The mass flow controller 23, the storage tank 24, and the furnace opening valve 25 are provided in this order from the gas source 22 in the middle of the gas supply pipe 21.

The gas source 22 supplies a processing gas into the storage tank 24 and the processing container 10. The gas source 22 may be, for example, a tank filled with a processing gas or a connection port to which a processing gas is supplied. The processing gas includes, for example, a raw material gas used for the film forming process and an etching gas used for the etching process.

The mass flow controller 23 measures the mass flow rate of the processing gas supplied from the gas source 22 and stored in the storage tank 24, to control the flow rate.

The storage tank 24 stores a processing gas, and is provided to supply a large amount of processing gas into the processing container 10 in a short time. The storage tank 24 temporarily stores the large amount of processing gas, and supplies the processing gas into the processing container 10 at once in a short time, so that the large amount of processing gas may be supplied in a short time. The storage tank 24 is also referred to as a buffer tank.

An electropneumatic regulator 44 to be described later controls the opening degree of the furnace opening valve 25. By controlling the opening degree of the furnace opening valve 25, the discharge amount of the processing gas supplied from the storage tank 24 into the processing container 10 is controlled.

The exhaust 30 includes, for example, an exhaust pipe 31, an exhaust valve 32, and an exhaust device 33.

The exhaust pipe 31 exhausts the processing gas in the processing container 10, and is connected to, for example, an exhaust port (not illustrated) of the processing container 10. The exhaust valve 32 and the exhaust device 33 are provided in this order from the side of the processing container 10 in the middle of the exhaust pipe 31.

The exhaust valve 32 adjusts the exhaust amount of the processing gas that flows through the exhaust pipe 31. The exhaust valve 32 may be, for example, an automatic pressure controller (APC) valve.

The exhaust device 33 evacuates the inside of the processing container 10 through the exhaust pipe 31. The exhaust device 33 includes, for example, a vacuum pump such as a dry pump or a turbo molecular pump.

The discharge amount controller 40 controls the discharge amount of the processing gas supplied from the storage tank 24 into the processing container 10. The discharge amount controller 40 includes, for example, a pressure sensor 41, a controller 42, an input device 43, and the electropneumatic regulator 44.

The pressure sensor 41 is provided in the storage tank 24. The pressure sensor 41 detects the pressure inside the storage tank 24 (hereinafter, also referred to as a "tank internal pressure"), and outputs the obtained detection value to the controller 42.

The controller 42 is configured to perform an arithmetic processing including a control. The controller 42 may be, for example, a computer. The controller 42 is configured to control the opening degree of the furnace opening valve 25 via the electropneumatic regulator 44, based on the detection value of the pressure sensor 41. The controller 42 may be configured to control the opening degree of the furnace opening valve 25 without using the electropneumatic regulator 44.

The input device 43 enables, for example, an operator to input various types of information. The various types of information include, for example, the discharge amount of the processing gas desired to be supplied from the storage tank 24 into the processing container 10. The discharge amount of the processing gas is specified by, for example, a pressure value. Hereinafter, the specified pressure value will be referred to as a set discharge pressure. The input device 43 may be included in, for example, an apparatus controller that controls the entire processing apparatus 1, or may be a computer provided separately from the apparatus controller.

The electropneumatic regulator 44 controls the opening degree of the furnace opening valve 25 using a pneumatic pressure based on a command (electric signal) from the controller 42.

[Gas Supply Method]

Figure 2:
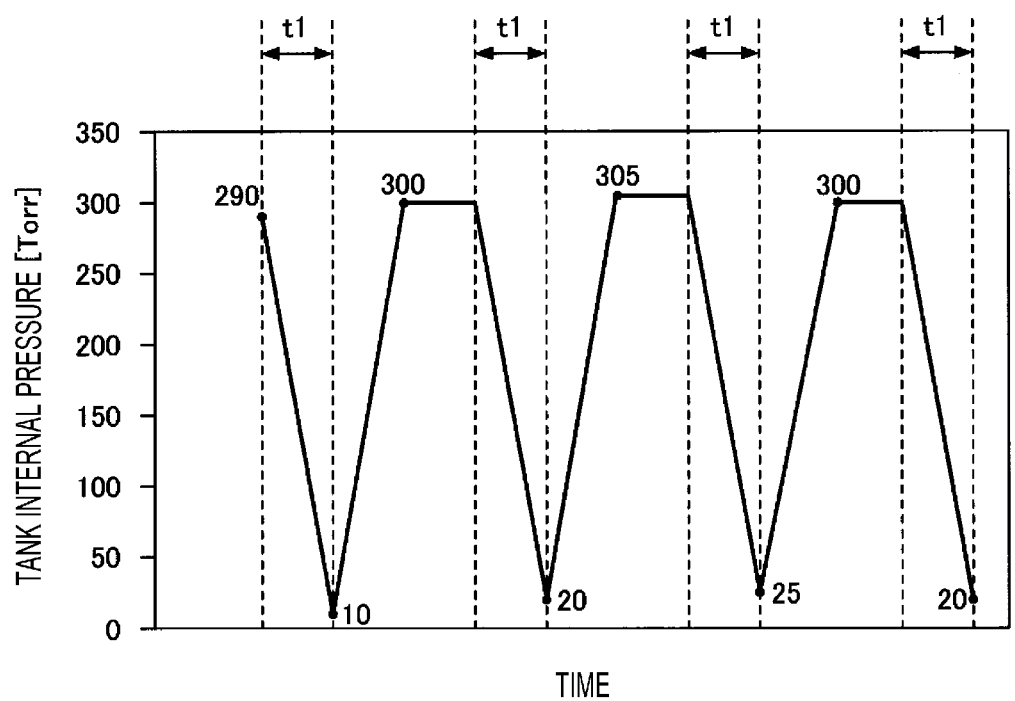
FIG. 2 is a view illustrating an example of a gas supply method according to an embodiment.

Referring to FIG. 2, descriptions will be made on a case where a film formation is performed through the ALD that deposits a film by intermittently supplying a processing gas into the processing container 10, as an example of the gas supply method of the embodiment. FIG. 2 is a view illustrating an example of the gas supply method of the embodiment, and represents a temporal variation of the tank internal pressure when the processing gas is intermittently supplied from the inside of the storage tank 24 into the processing container 10. In FIG. 2, the horizontal axis represents time, and the vertical axis represents the tank internal pressure [Torr].

In the following, it is assumed that the substrate is accommodated in the processing container 10, and the processing gas is stored in the storage tank 24 such that the tank internal pressure becomes 290 Torr at the time when the gas supply method is started. Further, it is assumed that 280 Torr is input as the set discharge pressure through the input device 43 by, for example, the operator prior to the start of the gas supply method.

First, the controller 42 transmits a command to the electropneumatic regulator 44 to open the furnace opening valve 25. Based on the command, the electropneumatic regulator 44 opens the furnace opening valve 25. As a result, a first supply of the processing gas from the inside of the storage tank 24 into the processing container 10 is started, and the tank internal pressure starts to decrease from 290 Torr.

When the first supply of the processing gas is started, the controller 42 controls the furnace opening valve 25 in a variable opening degree mode. The variable opening degree mode refers to a mode for controlling the opening degree of the furnace opening valve 25 such that the drop amount of the tank internal pressure becomes equal to the set discharge pressure in a predetermined time. The drop amount of the tank internal pressure is calculated by subtracting the detection value of the pressure sensor 41 in a state where the furnace opening valve 25 is opened, from the detection value of the pressure sensor 41 before the furnace opening valve 25 is opened. In the example of FIG. 2, the controller 42 controls the opening degree of the furnace opening valve 25 such that the drop amount of the tank internal pressure becomes equal to the set discharge pressure of 280 Torr, that is, the tank internal pressure becomes 10 Torr (290 Torr-280 Torr), in a predetermined time t1.

After the predetermined time elapses, the controller 42 transmits a command to the electropneumatic regulator 44 to close the furnace opening valve 25. Based on the command, the electropneumatic regulator 44 closes the furnace opening valve 25. As a result, the first supply of the processing gas from the inside of the storage tank 24 into the processing container 10 is stopped. Further, the controller 42 controls, for example, an opening/closing valve (not illustrated) or the mass flow controller 23 interposed between the gas source 22 and the storage tank 24, to supply the processing gas from the gas source 22 into the storage tank 24 and store the processing gas in the storage tank 24. In the example of FIG. 2, the processing gas is stored in the storage tank 24 until the tank internal pressure reaches 300 Torr.

Next, the controller 42 transmits a command to the electropneumatic regulator 44 to open the furnace opening valve 25. Based on the command, the electropneumatic regulator 44 opens the furnace opening valve 25. As a result, a second supply of the processing gas from the inside of the storage tank 24 into the processing container 10 is started, and the tank internal pressure starts to decrease from 300 Torr.

When the second supply of the processing gas is started, the controller 42 controls the furnace opening valve 25 in the variable opening degree mode. In the example of FIG. 2, the controller 42 controls the opening degree of the furnace opening valve 25 such that the drop amount of the tank internal pressure becomes equal to the set discharge pressure of 280 Torr, that is, the tank internal pressure becomes 20 Torr (300 Torr-280 Torr), in the predetermined time t1.

After the predetermined time elapses, the controller 42 transmits a command to the electropneumatic regulator 44 to close the furnace opening valve 25. Based on the command, the electropneumatic regulator 44 closes the furnace opening valve 25. As a result, the second supply of the processing gas from the inside of the storage tank 24 into the processing container 10 is stopped. Further, the controller 42 controls, for example, an opening/closing valve (not illustrated) or the mass flow controller 23 interposed between the gas source 22 and the storage tank 24, to supply the processing gas from the gas source 22 into the storage tank 24 and store the processing gas in the storage tank 24. In the example of FIG. 2, the processing gas is stored in the storage tank 24 until the tank internal pressure reaches 305 Torr.

Then, the controller 42 performs third and subsequent supplies of the processing gas in the same manner as that for the first and second supplies of the processing gas. In the third supply of the processing gas, the controller 42 controls the opening degree of the furnace opening valve 25 such that the drop amount of the tank internal pressure becomes equal to the set discharge pressure of 280 Torr, that is, the tank internal pressure becomes 25 Torr (305 Torr-280 Torr), in the predetermined time. In the fourth supply of the processing gas, the controller 42 controls the opening degree of the furnace opening valve 25 such that the drop amount of the tank internal pressure becomes equal to the set discharge pressure of 280 Torr, that is, the tank internal pressure becomes 20 Torr (300 Torr-280 Torr), in the predetermined time.

Then, the supply of the processing gas is performed a set number of times, so that a film having a desired film thickness is deposited on the substrate. The set number of times is determined by, for example, recipes.

In the film formation by the ALD in the processing apparatus 1, the uniformity of film thickness among devices may be deteriorated by a deviation or aging of hardware such as, for example, the storage tank 24, the furnace opening valve 25, the exhaust valve 32, the exhaust device 33, and the injector. It is believed that this is because the supply amount of the processing gas from the inside of the storage tank 24 into the processing container 10 is unstable due to the variation or aging of hardware.

As an example of a method of stabilizing the supply amount of the processing gas into the processing container, there is a method of using a furnace inlet valve in which a CV value is strictly controlled. However, this method has a limit in product yield.

As another example of the method of stabilizing the supply amount of the processing gas into the processing container, there is a method of taking a detection value of a pressure sensor provided on a secondary side of the processing container into the controller, and controlling the supply amount of the processing gas such that the detection value becomes constant every time. However, in this method, a quick and precise control is difficult because due to the processing container disposed between the storage tank and the pressure sensor, a time lag occurs until the detection value of the pressure sensor is obtained after the processing gas is supplied from the storage tank into the processing container.

According to the gas supply method of the embodiment, the controller 42 controls the opening degree of the furnace opening valve 25 based on the detection value of the pressure sensor 41 that monitors the pressure in the storage tank 24. That is, the controller 42 directly controls the supply amount itself of the processing gas supplied from the inside of the storage tank 24 into the processing container 10. Thus, the supply amount of the processing gas into the processing container 10 may be controlled quickly and precisely. As a result, the pressure in the processing container 10 may also be precisely controlled.

According to the gas supply method of the embodiment, when the furnace opening valve 25 is opened, the controller 42 controls the opening degree of the furnace opening valve 25 such that the drop amount of the tank internal pressure becomes equal to the set discharge pressure in the predetermined time. As a result, the processing gas having the set discharge pressure may be supplied from the inside of the storage tank 24 into the processing container 10 in the predetermined time, so that the same amount of processing gas may be supplied into the processing container 10 every time for the film formation by the ALD. As a result, the uniformity of film thickness is improved.

In the embodiment described above, the controller 42 controls the furnace opening valve 25 in the variable opening degree mode immediately after the furnace opening valve 25 is opened. However, the present disclosure is not limited thereto. For example, the controller 42 may control the furnace opening valve 25 in a fixed opening degree mode until a predetermined time elapses after the furnace opening valve 25 is opened, and may control the furnace opening valve 25 in the variable opening degree mode thereafter. The fixed opening degree mode refers to a mode for fixing the furnace opening valve 25 to a constant opening degree. For example, when the opening degree of the furnace opening valve 25 is set to be large in the fixed opening degree mode, a large amount of processing gas may be supplied from the inside of the storage tank 24 into the processing container 10 in a short time immediately after the furnace opening valve 25 is opened, so that the supply amount of the processing gas may be precisely adjusted in the remaining time.

EXAMPLES

Examples in which the gas supply method of the embodiment was performed will be described with reference to FIGS. 3 and 4. In the Examples, the furnace opening valve 25 was controlled in the fixed opening degree mode until a predetermined time (0.5 seconds) elapsed after the furnace opening valve 25 was opened, and controlled in the variable opening degree mode after the predetermined time elapsed. The sum of the time during which the furnace opening valve 25 was controlled in the fixed opening degree mode and the time during which the furnace opening valve 25 was controlled in the variable opening degree mode was set to three seconds. Further, the Examples were performed under five Conditions A to E which were different from each other in combination of the tank internal pressure before the furnace opening valve 25 was opened (hereinafter, referred to as the "tank internal pressure during the storage") and the set discharge pressure. In the Examples, the evaluation was performed using nitrogen gas, instead of the processing gas.

For Condition A, the tank internal pressure during the storage was set to 380 Torr, the set discharge pressure was set to 300 Torr, and a target tank internal pressure was 80 Torr (380 Torr-300 Torr).

For Condition B, the tank internal pressure during the storage was set to 360 Torr, the set discharge pressure was set to 300 Torr, and the target tank internal pressure was 60 Torr (360 Torr-300 Torr).

For Condition C, the tank internal pressure during the storage was set to 310 Torr, the set discharge pressure was set to 290 Torr, and the target tank internal pressure was 20 Torr (310 Torr-290 Torr).

For Condition D, the tank internal pressure during the storage was set to 340 Torr, the set discharge pressure was set to 310 Torr, and the target tank internal pressure was 30 Torr (340 Torr-310 Torr).

For Condition E, the tank internal pressure during the storage was set to 300 Torr, the set discharge pressure was set to 280 Torr, and the target tank internal pressure was 20 Torr (300 Torr-280 Torr).

Figure 3:
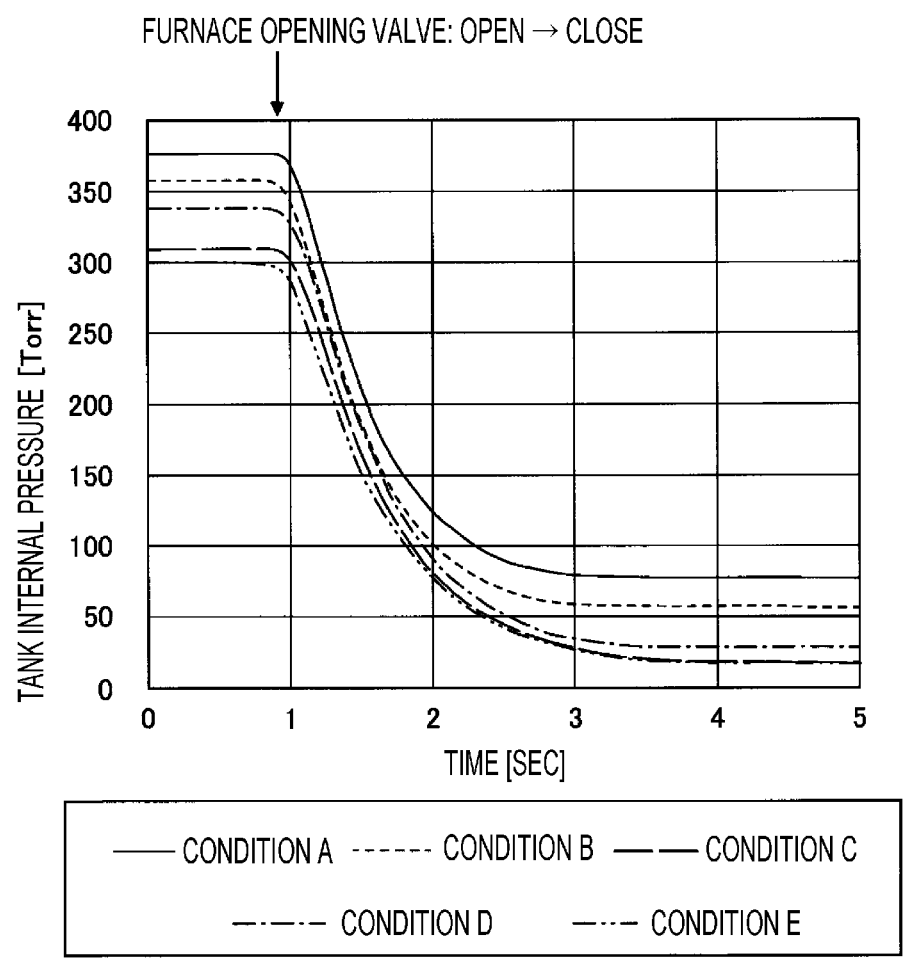
FIG. 3 is a view illustrating results obtained from measuring a temporal variation of a tank internal pressure.

FIG. 3 is a view illustrating results obtained from measuring the temporal variation of the tank internal pressure. In FIG. 3, the horizontal axis represents time [seconds], and the vertical axis represents the tank internal pressure [Torr]. In FIG. 3, a solid line, a dotted line, a dashed line, an alternate long and short dashes line, and an alternate one long and two short dashes line represent results of Conditions A to E, respectively.

As illustrated in FIG. 3, it may be seen that in all of Conditions A to E, the tank internal pressure significantly drops immediately after the furnace opening valve 25 is opened, and then, stabilizes at the target tank internal pressure. This result represents that a large amount of processing gas may be supplied from the inside of the storage tank 24 into the processing container 10 in a short time immediately after the furnace opening valve 25 is opened, and the supply amount of the processing gas may be adjusted precisely in the remaining time.

FIG. 4 is a view illustrating results obtained from calculating an error between the set discharge amount and the actual discharge amount. FIG. 4 represents the condition, the tank internal pressure during the storage [Torr], the target tank internal pressure [Torr], the set discharge amount (set discharge pressure) [Torr], the actual discharge amount (actual discharge pressure) [Torr], and the error (the actual discharge amount—the set discharge amount) [Torr] in this order from the left column.

As illustrated in FIG. 4, it may be seen that in all of Conditions A to E, the error between the actual discharge amount and the set discharge amount is less than 2 Torr. This result represents that the supply amount of the processing gas from the inside of the storage tank 24 into the processing container 10 may be precisely adjusted in all of Conditions A to E.

According to the present disclosure, the supply amount of the processing gas into the processing container may be precisely adjusted.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing apparatus comprising: a processing container configured to accommodate a substrate; a storage tank connected to the processing container via a gas supply pipe; a pressure sensor configured to detect a pressure in the storage tank; a valve provided in the gas supply pipe between the processing container and the pressure sensor of the storage tank; and a controller configured to control an opening degree of the valve in an open state based on the pressure in the storage tank detected by the pressure sensor to make a drop amount of the pressure in the storage tank become equal to a set discharge pressure of a gas supplied from the storage tank to the processing container through the valve, wherein the controller is configured to control the opening degree of the valve in a first mode for fixing the valve to a constant opening degree, and subsequently control the opening degree of the valve in a second mode for controlling the opening degree of the valve to make the drop amount of the pressure in the storage tank become equal to the set discharge pressure.

2. The processing apparatus according to claim 1, further comprising:

an input device configured to input the set discharge pressure.

3. The processing apparatus according to claim 1, wherein the storage tank stores a raw material gas.

4. The processing apparatus according to claim 1, wherein the controller is configured to perform a film formation by an atomic layer deposition (ALD) that deposits a film by intermittently supplying a gas from an inside of the storage tank into the processing container, and control the opening degree of the valve based on the pressure detected by the pressure sensor when the gas is supplied into the processing container.

5. The processing apparatus according to claim 1, wherein the controller is configured to control the opening degree of the valve to make a drop amount of the pressure in the storage tank for a first discharge period become equal to the set discharge pressure.

6. The processing apparatus according to claim 5, wherein the controller is configured to control the opening degree of the valve to make a drop amount of the pressure in the storage tank for a second discharge period become equal to the set discharge pressure, and
wherein the first discharge period and the second discharge period are equal to each other in length of time.

7. The processing apparatus according to claim 1, wherein the drop amount of the pressure is calculated by subtracting the detection value of the pressure sensor in a state where the valve is opened, from the detection value of the pressure sensor before the valve is opened.

8. A gas supply method comprising: storing a gas in a storage tank connected to a processing container via a gas supply pipe; and supplying the gas stored in the storage tank into the processing container, wherein a valve is provided in the gas supply pipe between the processing container and a pressure sensor of the storage tank, and in the supplying, the opening degree of the valve in an open state is controlled based on a pressure in the storage tank detected by the pressure sensor, wherein, in the supplying, the opening degree of the valve is controlled to make a drop amount of the pressure in the storage tank become equal to a set discharge pressure of a gas supplied from the storage tank to the processing container through the valve, wherein, in the supplying, the opening degree of the valve is controlled in a first mode for fixing the valve to a constant opening degree, and subsequently, controlled in a second mode for controlling the opening degree of the valve to make the drop amount of the pressure in the storage tank become equal to the set discharge pressure.

9. The gas supply method according to claim 8, wherein the controller is configured to control the opening degree of the valve to make a drop amount of the pressure in the storage tank for a first discharge period become equal to the set discharge pressure.

10. The gas supply method according to claim 9, wherein the controller is configured to control the opening degree of the valve to make a drop amount of the pressure in the storage tank for a second discharge period become equal to the set discharge pressure, and
wherein the first discharge period and the second discharge period are equal to each other in length of time.

* * * * *